(12) United States Patent
Leussler et al.

(10) Patent No.: US 10,749,483 B2
(45) Date of Patent: Aug. 18, 2020

(54) AMPLIFIER DEVICE FOR AN ANTENNA-LIKE MRI TRANSDUCER AND CORRESPONDING MRI APPARATUS

(71) Applicant: KONINKLIJKE PHILIPS N.V., Eindhoven (NL)

(72) Inventors: Christoph Leussler, Hamburg (DE); Peter Vernickel, Hamburg (DE)

(73) Assignee: Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 16/149,521

(22) Filed: Oct. 2, 2018

(65) Prior Publication Data
US 2019/0036496 A1 Jan. 31, 2019

Related U.S. Application Data

(63) Continuation-in-part of application No. PCT/EP2017/057904, filed on Apr. 4, 2017.

(30) Foreign Application Priority Data

Apr. 5, 2016 (EP) ..................................... 16163777

(51) Int. Cl.
*H03F 1/56* (2006.01)
*G01R 33/36* (2006.01)
(Continued)

(52) U.S. Cl.
CPC ......... *H03F 1/565* (2013.01); *G01R 33/3614* (2013.01); *G01R 33/3628* (2013.01);
(Continued)

(58) Field of Classification Search
CPC . H03F 1/565; H03F 3/19; H03F 3/245; H03F 2200/222; H03F 2200/387;
(Continued)

(56) References Cited

U.S. PATENT DOCUMENTS 4,599,585 A 7/1986 Vorhaus et al.
4,736,161 A 4/1988 Prevot et al.
(Continued)

OTHER PUBLICATIONS

Marion et al An alternative tuning approach to enhance NMR signals Journal of Magnetic Resonance, vol. 193 (2008)153 157.
(Continued)

*Primary Examiner* — Christopher P McAndrew (57) ABSTRACT

An amplifier device (14) is adapted for an antenna-like transducer for MRI applications, especially for an RF coil. The amplifier device (14) includes at least one amplifier channel (16) including: an input connection device (18) for connecting an RF signal source (12); an output connection device (20) for connecting the antenna-like RF transducer; an RF amplifier unit (22); and an impedance matching circuit (24) configured to adapt the coupling of the RF amplifier unit (22) to the actually connected antenna-like RF transducer with regard to an actual load of the amplifier device (14). The load results from the combination of the antenna-like RF transducer and a person or sample interacting with the antenna-like RF transducer. The impedance matching circuit (24) establishes an electric line (34) between the RF amplifier unit (22) and the antenna-like transducer with an adjustable line length.

13 Claims, 6 Drawing Sheets

| degrees | Switch 38 | | | | | | | | Switch 42 | |
|---|---|---|---|---|---|---|---|---|---|---|
| | #1 | #2 | #3 | #4 | #5 | #6 | #7 | #8 | #1 | #2 |
| 0 | 1 | 0 | 0 | 0 | 0 | 0 | 0 | 0 | 0 | 0 |
| 45 | 0 | 1 | 0 | 0 | 0 | 0 | 0 | 0 | 1 | 1 |
| 90 | 0 | 0 | 1 | 0 | 0 | 0 | 0 | 0 | 0 | 1 |
| 135 | 0 | 0 | 0 | 1 | 0 | 0 | 0 | 0 | 1 | 0 |
| 180 | 0 | 0 | 0 | 0 | 1 | 0 | 0 | 0 | 0 | 0 |
| 225 | 0 | 0 | 0 | 0 | 0 | 1 | 0 | 0 | 1 | 1 |
| 270 | 0 | 0 | 0 | 0 | 0 | 0 | 1 | 0 | 0 | 1 |
| 315 | 0 | 0 | 0 | 0 | 0 | 0 | 0 | 1 | 1 | 0 |

1 = diode forward biassed  0 = diode reverse biassed (51) Int. Cl.
*H03H 7/38* (2006.01)
*H01P 1/185* (2006.01)
*H03F 3/19* (2006.01)
*H03F 3/24* (2006.01)

(52) U.S. Cl.
CPC ............... *H01P 1/185* (2013.01); *H03F 3/19* (2013.01); *H03F 3/245* (2013.01); *H03H 7/38* (2013.01); *H03F 2200/222* (2013.01); *H03F 2200/387* (2013.01); *H03F 2200/451* (2013.01)

(58) Field of Classification Search
CPC .......... H03F 2200/451; G01R 33/3614; G01R 33/3628; H03H 7/38; H01P 1/185
USPC ........................................................ 324/322
See application file for complete search history.

(56) References Cited

U.S. PATENT DOCUMENTS

| | | | | |
|---|---|---|---|---|
| 4,812,764 | A | 3/1989 | Bendall | |
| 5,450,011 | A | 9/1995 | Boeijen et al. | |
| 5,670,881 | A | 9/1997 | Arakawa et al. | |
| 6,429,733 | B1 * | 8/2002 | Pagliolo | H03H 11/0422 327/552 |
| 6,462,620 | B1 * | 10/2002 | Dupuis | H01L 27/08 257/E27.046 |
| 6,583,661 | B1 * | 6/2003 | Tanji | H03F 1/301 327/355 |
| 7,683,718 | B2 * | 3/2010 | Dishop | H03F 3/211 330/269 |
| 7,898,340 | B2 * | 3/2011 | Heston | H01P 5/02 330/190 |
| 8,031,003 | B2 * | 10/2011 | Dishop | H03F 3/211 330/269 |
| 8,525,518 | B1 | 9/2013 | Qian | |
| 8,571,630 | B2 | 10/2013 | Lips et al. | |
| 9,209,760 | B2 * | 12/2015 | Ono | H03F 1/56 |
| 2002/0013525 | A1 | 1/2002 | Scott | |
| 2002/0024403 | A1 | 2/2002 | Du Toit et al. | |
| 2004/0251984 | A1 | 12/2004 | Javor | |
| 2006/0173285 | A1 | 8/2006 | Mallozzi et al. | |
| 2008/0093262 | A1 | 4/2008 | Gragnani et al. | |
| 2009/0066440 | A1 | 3/2009 | Chan Wai Po et al. | |
| 2010/0094123 | A1 | 4/2010 | David | |
| 2010/0277171 | A1 * | 11/2010 | Zhang | G01R 33/3415 324/309 |
| 2011/0241682 | A1 * | 10/2011 | Gudino | G01R 33/3614 324/318 |
| 2012/0062230 | A1 | 3/2012 | Vaughan et al. | |
| 2012/0223709 | A1 * | 9/2012 | Schillak | G01R 33/3607 324/309 |
| 2012/0256689 | A1 | 10/2012 | El Kaamouchi | |
| 2013/0285659 | A1 | 10/2013 | Sohn et al. | |
| 2014/0176135 | A1 * | 6/2014 | Griswold | G01R 33/5612 324/314 |
| 2014/0292327 | A1 * | 10/2014 | Griswold | G01R 33/3614 324/309 |
| 2014/0312986 | A1 * | 10/2014 | Edelstein | H03H 7/38 333/33 |
| 2017/0359034 | A1 | 12/2017 | Hussein et al. | |

OTHER PUBLICATIONS

Theeuwen et al "LDMOS Transistors in Power Microwave Applications" Jan. 2008.

* cited by examiner

AMPLIFIER DEVICE FOR AN ANTENNA-LIKE MRI TRANSDUCER AND CORRESPONDING MRI APPARATUS

CROSS-REFERENCE TO PRIOR APPLICATIONS

This application is a continuation in part of PCT/EP2017/057904 filed April 4, which claims the priority of EP application 16163777.2 filed Apr. 5, 2016, all of which are incorporated herein in whole by reference.

FIELD OF THE INVENTION

The invention relates to an amplifier device adapted for an antenna-like transducer for MRI applications like an RF coil, wherein the amplifier device comprises at least one amplifier channel including: (i) an input connection device for connecting an RF signal source; (ii) an output connection device for connecting the antenna-like RF transducer; (iii) an RF amplifier unit; and (iv) an impedance matching circuit. The invention further relates to the corresponding MRI apparatus.

BACKGROUND OF THE INVENTION

The performance of amplifier devices (including parameters like linearity, gain, efficiency, max. available output power) depends on the load connected to said amplifier. The parameters of these amplifier devices are often optimized for a specific reference load, e.g. 50 ohms. That requires matching inside the amplifier device from the impedance at transistor terminals to the cable connectors (50 ohms). Furthermore it requires matching of the antennae to the connecting cables.

For MRI applications (MRI: Magnetic Resonance Imaging) the matching circuits are typically tuned to a fix impedance so that not all patient loading cases can be covered optimally. A compromise is to optimally match to a large patient loading which requests the highest amount of RF power (RF: radio frequency) for the desired B1-field. In cases with lower coil loading less RF power is used to generate the same B1 field in the coil. Thus a certain level of reflection at the coil due to mismatch can be accepted. This strategy worked successfully for single channel transmit systems. However, with RF shimming with two channels and more the demands change so that the tuning to the strongly loaded situation does not always fit.

This rises the demands of a more flexible architecture so that the amplifier unit (by active, adaptive means) can handle a wider range of loading situations (for different regions in the impedance plane of the smith chart without a degradation of the performance.

The gain, efficiency, thermal stress and power output depends on the impedance seen by the amplifier, which depends on the loading and coupling to other output connection devices (e.g. RF coil ports). As an example for a given mismatch up to VSWR 1:4 (VSWR: voltage standing wave ratio), the maximum available RF output power can vary by a factor of 2. That strongly adds to the costs of the MR system if the amplifier unit needs to be over specified by a factor of ~2 to cover all impedances.

If the RF amplifier unit is located close to the RF coil, the impedance matching to the coil loading offers the chance to provide active impedance matching inside the RF amplifier device. By integrating in the impedance management a variable impedance circuit, the system cost of the RF amplifier can be considerably being reduced.

The advantage is that the internal communication and monitoring boards which control the RF amplifier can additionally control the impedance matching of the RF amplifier output. An RF amplifier needs to be robust for standing wave ratio (SWR) of up to 1:6. Optimal gain and efficiency matching needs to include information of the load pull characteristics of the RF amplifier output. For reasons of SAR safety (SAR: Specific Absorption Rate), the whole RF chain has to be calibrated and continuously monitored.

Document US 2013/0285659 A1 shows an amplifier device adapted for an RF coil for MRI applications and a corresponding MRI apparatus. The amplifier device comprises a plurality of amplifier channels, each channel including: (i) an input connection device for connecting an RF signal source; (ii) an output connection device for connecting the RF coil; (iii) an RF amplifier unit; and (iv) an impedance matching network. The matching network matches the impedance by means of adjustable capacitors, wherein the matching is based on a mismatch detection using a reflected signal level from the RF amplifier unit. Further, in the paper '*An alternative tuning approach to enhance NMR signals*' by D. J. Y Marion and H. Desvaux in JMRI 193(2008)153 157 an experimental set up is shown for an NMR probe where it was found that the modulation of the length of wire between the amplifier and a point (A) before the diodes on the amplifier shows a minimum in the reflected power.

SUMMARY OF THE INVENTION

It is an object of the invention to provide a cost-effective and unsusceptible RF amplifier device for MRI applications and a corresponding MRI apparatus comprising such an amplifier device.

This object is achieved by the features of the independent claims. The dependent claims detail advantageous embodiments of the invention.

According to various embodiments of the invention the amplifier device adapted for an antenna-like transducer for MRI applications comprises at least one amplifier channel including: (i) an input connection device for connecting an RF signal source; (ii) an output connection device for connecting the antenna-like RF transducer; (iii) an RF amplifier unit; and (iv) an impedance matching circuit configured to adapt the coupling of the RF amplifier unit to the actually connected antenna-like RF transducer with regard to an actual load of the amplifier device, which load results from the combination of the antenna-like RF transducer and a person or sample interacting with the antenna-like RF transducer, wherein the impedance matching circuit establishes an electric line (transmission line) between the RF amplifier unit and the antenna-like transducer with an adjustable line length. The antenna-like transducer for MRI applications preferably is an RF coil or an RF conductor loop and the RF amplifier unit preferably is an RF power amplifier. These kind of RF power amplifier are, e.g., used to amplify RF pulses generated by a pulse generator connected to the input side of the RF power amplifier.

The electric line is a transmission line or cable with adjustable line length or cable length. In contrast to other types of amplifier devices it is not required to adjust the matching to come close(r) to 50 ohms (optimal power transfer from source to load), which is usually the iso-center of the corresponding smith chart. It is sufficient to turn the phase of the impedance seen by the amplifier unit to get into a preferred working zone (a kind of "comfort zone") of the amplifier unit (rotating along a circle within the smith chart with constant distance to z=50 ohm). This is typically done by adjusting the line/cable lengths, without the absolute need for tunable capacitances/inductors.

The "preferred" working zone could be:
a zone providing maximum available RF power;
a zone providing best efficiency (max available average power);
a zone providing lowest amplifier internal losses (best over-time stability);
a zone providing best RF linearity; or
a zone defined per semiconductor device (e.g. FET: field-effect transistor) temperature monitoring—Mean Time Between Failures (MTBF) depends on temperature and duration.

These optima do not occur always on the same termination impedance. Thus, depending on the MR sequence the termination impedance would be optimized for a single parameter or a compromise of selected parameters.

The amplifier device according to these various embodiments of the invention enables easy switching the effective line length to achieve impedance matching. Further, the impedance matching circuit includes an additional line segment that is (i) switchable connected to the electrical transmission line and (ii) switchable connected to ground. The additional line segment avoids that a signal path occurs between the distal end of the segments forming the electrical transmission line to the load into the residual electrical transmission line. Seen from the distal end of the electrical transmission line the residual electrical transmission line should effectively end in a short.

According to a preferred embodiment of the invention the line length of the electric line is adjustable to form an integer wavelength at the current load.

According to another preferred embodiment of the invention the impedance matching circuit comprises a series of line segments of the given characteristic impedance $Z_0$ coupled by switches, especially diode switches, to establish the electric line of adjustable line length. By use of the switches the line segments can be connected successively to a serial connection of line elements within the electric line.

According to yet another preferred embodiment of the invention the amplifier device further comprises a software defined radio (SDR) unit (for a digital receiving of NMR signals) or other (digital) control unit providing a digital interface, which control unit measures the loading condition from the amplifier unit (input impedance of the antenna-like RF transducer) and controls the matching circuit.

According to yet another preferred embodiment of the invention the control unit directly controls the switches of the matching circuit.

According to another preferred embodiment of the invention the impedance matching circuit is operable in a high magnetic $B_0$ field of a corresponding MRI apparatus.

According to yet another preferred embodiment of the invention the amplifier device further comprises a printed circuit board (PCB), wherein the RF amplifier unit and the matching circuit are arranged on said printed circuit board.

According to a preferred embodiment of the invention the impedance matching circuit further comprises at least one capacitive component of adjustable capacity and/or at least one inductive component of adjustable inductance. These measures improve the matching abilities of the matching circuit.

According to another preferred embodiment of the invention the at least one amplifier channel includes a further impedance matching circuit. This further impedance matching circuit is preferably located on the input side of the RF amplifier unit. On the other hand, the further matching circuit can be a circuit for fixed impedance matching.

According to yet another preferred embodiment of the invention the amplifier device further comprises a plurality of amplifier channels.

Each of these amplifier channels preferably comprises an individual RF amplifier unit and/or an individual impedance matching circuit.

According to another preferred embodiment of the invention the RF amplifier unit is a MOSFET device (MOSFET: metal-oxide-semiconductor field-effect transistor) or comprises at least one MOSFET device.

According to yet another preferred embodiment of the invention the matching circuit is interconnected between the RF amplifier unit and the contact device.

According to preferred embodiments of the invention the adaptive matching circuit is part of the amplifier device itself (in terms of a single device) and not as a stand-alone unit. That extends the number of available adjustment parameters. Typically a solid state amplifier consists of several FETs in parallel, each with individual fix passive matching. We allow this matching of the individual FETs to be flexible.

According to another preferred embodiments of the invention the FET bias point is an item for modulation (not only a/some passive devices between FETs and load). So the adaptive matching optionally includes parameters like the individual drain currents and or supply voltages.

According to various embodiments of the invention, the MRI apparatus comprises an RF signal source, an antenna-like RF transducer, and an aforementioned amplifier device.

BRIEF DESCRIPTION OF THE DRAWINGS

These and other aspects of the invention will be apparent from and elucidated with reference to the embodiments described hereinafter.

In the drawings.

DETAILED DESCRIPTION OF EMBODIMENTS

Figure 1:
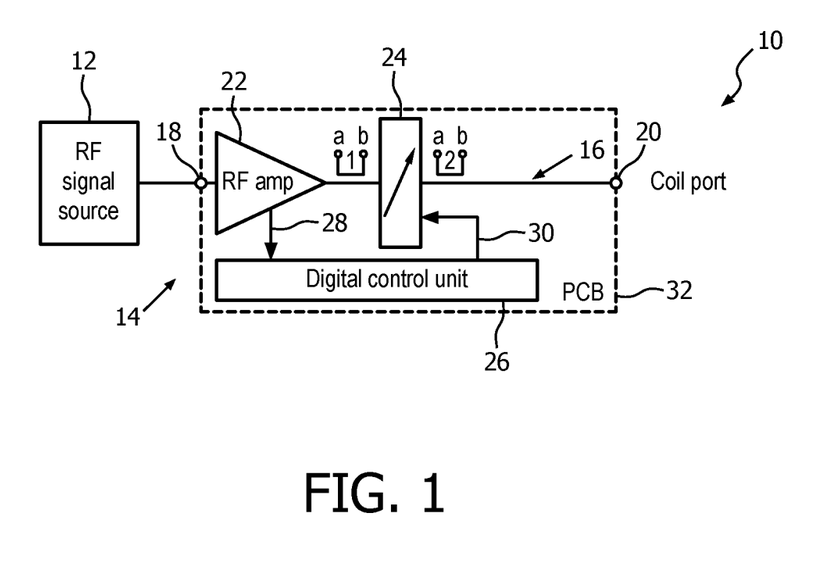
FIG. 1 shows an arrangement of an RF signal source and an amplifier device according to a preferred embodiment of the invention.

FIG. 1 shows a block diagram of an arrangement 10 of components of an MRI system comprising an RF signal source 12 (an RF transmitter) and an amplifier device 14. The amplifier device 14 is adapted for an RF coil (not shown) as used in MRI applications and comprises an amplifier channel 16, which channel 16 includes an input connection device 18 for connecting the RF signal source 12; an output connection device 20 (coil port) for connecting the RF coil; an RF amplifier unit 22; and an impedance matching circuit 24 configured to adapt the coupling of the RF amplifier unit 24 to the actually connected RF coil with regard to an actual load of the amplifier device 14, which load results from the combination of the RF coil and a person or sample interacting with the RF coil. The amplifier device 14 further comprises a control unit 26, which control unit 26 measures the loading condition from the RF amplifier unit 22 (arrow 28) and controls the matching circuit 24 (arrow 30). The control unit 26 provides a digital interface and therefore preferably is a digital control unit like a software defined radio unit (SDR unit). The RF amplifier unit 22, the impedance matching circuit 24 and the control unit 26 as well as corresponding lines interconnecting these components 22, 24, 26 are arranged on a printed circuit board (PCB) 32 of the amplifier device 14.

The impedance matching circuit 24 establishes an electric line 34 (shown in the upper part of FIG. 2) between the RF amplifier unit 22 and the output connection device 20.

Figure 2:
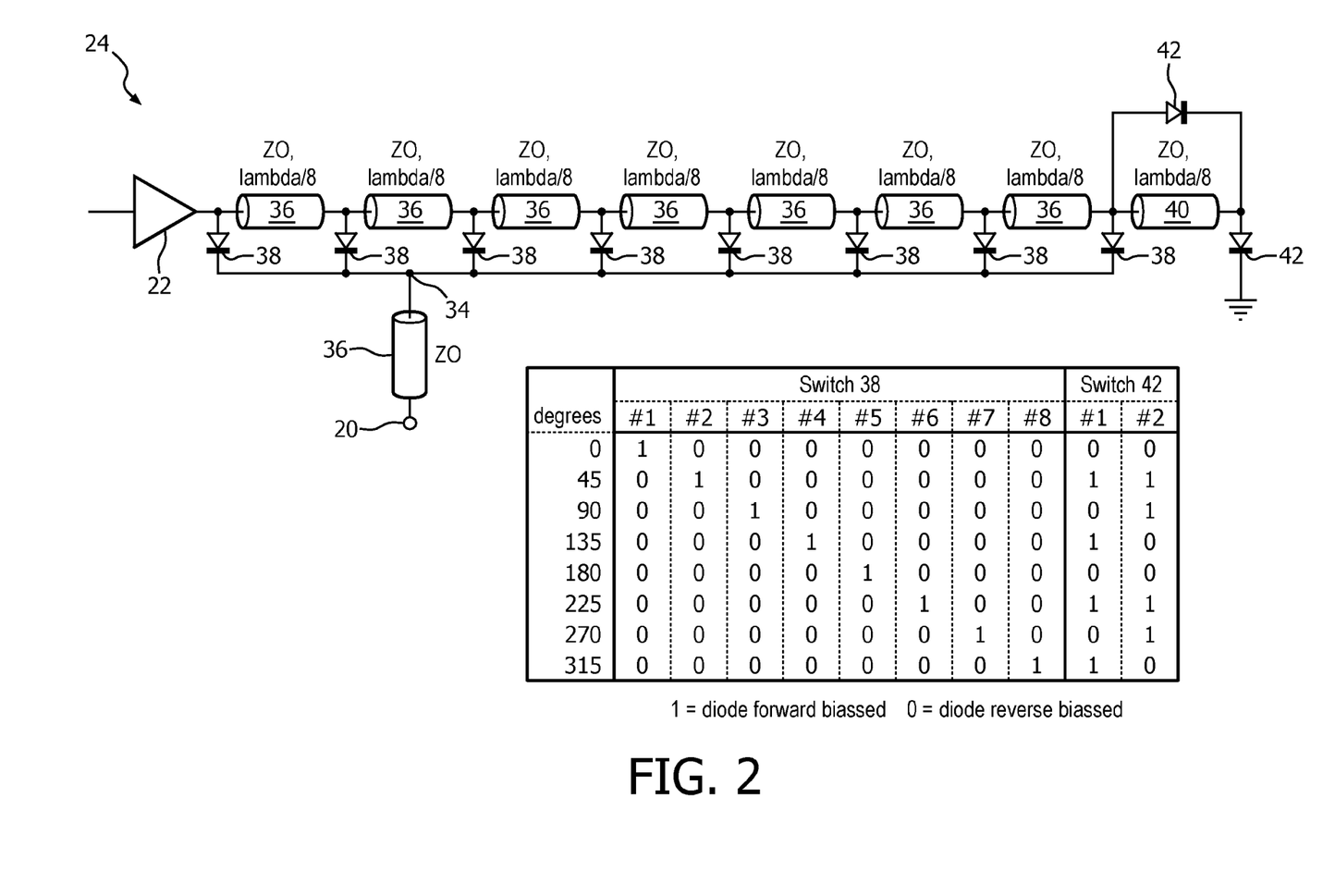
FIG. 2 shows an embodiment of an adaptive matching circuit of the amplifier device and a table of switching positions to control said matching circuit.

Due to the properties of the amplifier device with such an electric line (transmission line) 34 it is not required to adjust matching to come close(r) to 50 ohms. It is sufficient to turn the phase of the impedance seen by the RF amplifier unit 22 to get into a preferred working zone of said RF amplifier unit 22, which corresponds to a rotating along a circle within the smith chart with constant distance to z=50 ohms. This is typically done by adjusting the line/cable lengths, without the absolute need for tunable capacitances/inductors.

The upper part of FIG. 2 shows a solution to vary the line/cable length in 8 steps, allowing a nearly full rotation in the smith chart, namely an adaptive matching circuit 24 for modifying the phase of the load connected. The depicted circuit is a phase only adaptive matching circuit. The circuit establishes the electric line 34 of adjustable line length between the RF amplifier unit 22 and the RF coil by adding a variable cable length between the amplifier unit 22 and said RF coil. For this purpose the impedance matching circuit 24 comprises a series of line segments 36 of given impedance $Z_0$ (here 8 segments corresponding to 8 phase steps lambda/8) coupled by (diode) switches 38 to the output connection device 20 to establish the already mentioned electric line 34 of adjustable line length. Said line length is adjustable to an integer multiple of the wavelength at the current load. The length is selected by biasing a selected switches 38 like the sown diode switches or mechanical MEMs (MicroElectroMechanicals). The additional transmission segment 40 and the switches 42 are used for termination with respect to earth potential. Biasing of the switches 38, 42 for realizing a certain phase shift is given in the table shown in the lower part of FIG. 2.

FIG. 2 shows the amplifier 22 to supply an output signal to a load 20 over a segmented electrical transmission line. The load may be an electrical transmission radiofrequency coil or a transmit-receiver switch to which the electrical transmission RF coil is coupled. The electrical transmission line has a plurality (integer number k=1, 2 . . . 7) of segments of ⅛-wavelength ($\lambda$) coupled in series to an end-segment of arbitrary effective length 36, e.g. forming a length coax calbe that connects the node 34 to the load formed by the RF transmit coil with the impedance of the patient to be examined. Each node between adjacent segments is coupled to the end-segment by respective controllable switches (pin-diodes).

An additional segment 40 of ⅛-$\lambda$, is coupled to ground by a controllable switch as well. A controllable short is provided over the additional segment. The short is controlled by a switch parallel to the additional segment.

The effective length of the segmented electrical transmission line is adjusted by way of the various controllable switches 38,40s. The effective number of segments between the output of the amplifier and the load is controlled by setting the controllable switches 38 at the nodes between adjacent segments. In each configuration determining an effective length, one of the switches is closed, the other switches are closed. From the node at which the switch is closed, the segments distal from that node form a residual electrical transmission line that does not affect the phase delay between the amplifier and the load. This is achieved by (de-)activating the additional segment by switch 42. The additional segment can be independently shorted and connected to ground by switch 42.

Thus, there are four settings of the additional segment 40:

| 42-1 | 42-2 | effect of segment 40 |
| --- | --- | --- |
| open | closed | adds ⅛ $\lambda$ to ground |
| open | open | adds ⅛ $\lambda$ open ended |
| closed | closed | last node directly to ground and force a short |
| closed | open | last node open ended |

To avoid that a signal path occurs between the distal end of the segments forming the electrical transmission line to the load into the residual electrical transmission line, as seen from the distal end of the electrical transmission line the residual electrical transmission line should effectively end in a short. To achieve this, an even number of ⅛-$\lambda$, residual cable sections is created and one needs to take into account that when the residual electrical transmission line is arranged to have an even number of ⅛-$\lambda$, this may lead to an even or an odd number of ¼-$\lambda$, sections of the residual electrical transmission line. Each of a ¼-$\lambda$, section transforms the impedance from a short to an open or from an open to a short. Hence, if an even number of ¼-$\lambda$, sections occurs from the distal end of the electrical transmission line to the load, then the residual electrical transmission line ends in a short and no short needs to be forced by the switch 42-2. However, if an odd number of ¼-$\lambda$, occurs from the distal end of the electrical transmission line to the load, then the residual electrical transmission line would end in an open and a short needs to be forced by the switch 42-2 by connecting to ground.

In more detail the switching of the transmission line sections is as follows. The phase delay between amplifier and load is defined by the number of cable sections 36 used. Enabling one of the switches 38 defines the way of the signal flow through the selected number of cable sections 36 to the node 34. Doing so one has to make sure that the unused cable sections 36 of the residual electrical transmission line do not form an alternative signal path for the signal by creating a virtual open at the entry of the line of unused sections 36. This is achieved by using an electrical transmission line termination switch 42 at the end of the line of unused cable sections 36 selectively switching the inner conductor of the coax line to ground (short). Due to the variable length of the residual section one has to create several states of the switch 42 to create a proper impedance at the distal end of the segments switched to form the effective electrical transmission line. First, one has to create an even number of residual cable sections because an odd number of ⅛-$\lambda$, would create an undesired impedance transformation.

This is achieved by enabling or disabling the upper switch 42 (FIG. 2.). When biased the electrical transmission line section 40 is virtually not present, if this diode is not biased, the section 40 adds to the number of residual cable sections to achieve the requirement of having an even number of residual sections of ⅛-λ. Second, one has to determine if the length of the residual sections (now with or without section 40) is even or odd multiple of ¼-λ. In case of an even number of ¼-λ residual sections, which corresponds to having integer multiples of ½-wavelength sections: the switch 42-2 to ground has to be an "open", since multiples of ½-wavelength sections so as not to transform the termination impedance. In case of an odd number of ¼-λ, residual sections one has to enable switch 42 to ground forming a "short" to ground. Doing so the odd number of ¼-λ, residual sections transforms the "short" at the distal end to a "open" at the desired position.

Figure 3:
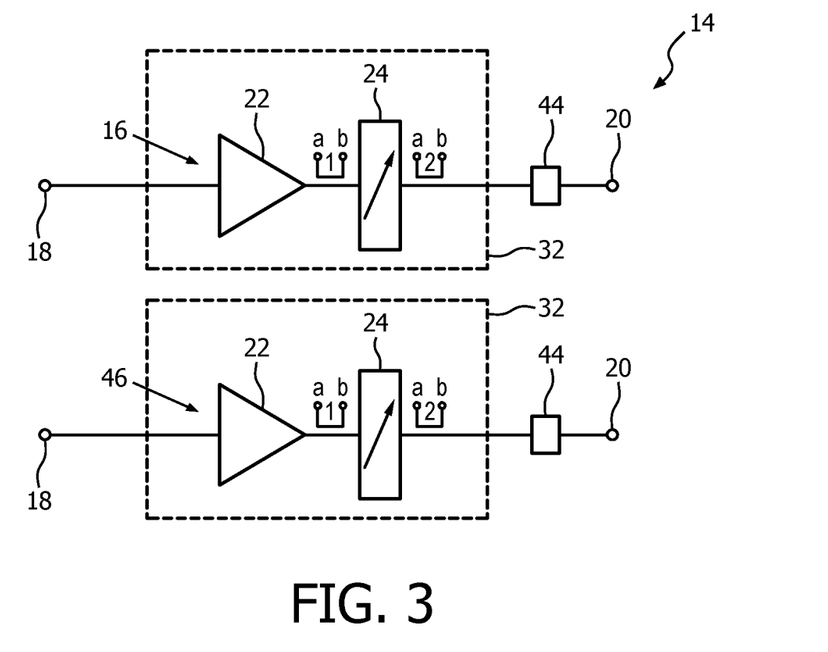
FIG. 3 shows another embodiment of the amplifier device.

FIG. 3 shows another embodiment of the amplifier device 14 providing more than one (namely two) amplifier channels 16, 46. Each channel 16, 46 is complemented by a further fixed impedance matching circuit 44.

The adaptive impedance matching is fully integrated on the PCB 32 of the RF amplifier device 14. The matching circuits 24 consist of circuit PCBs with the necessary electronics (inductors, capacitor matrix and switches) and are located directly on the RF amplifier PCB 32. As the RF amplifier units 22 are located close to the RF coil, a short low loss RF cable connects the respective RF amplifier unit 22 and the corresponding RF coil. A local pre-matching at the RF coil by means of the fixed impedance matching circuit 44 is optional. This pre-matching can transform the coil impedance to more beneficial impedance. One RF amplifier unit 22 has typically 4-8 kW, and consist of several sub-modules (single MOSFET) and corresponding combiner.

Figure 4:
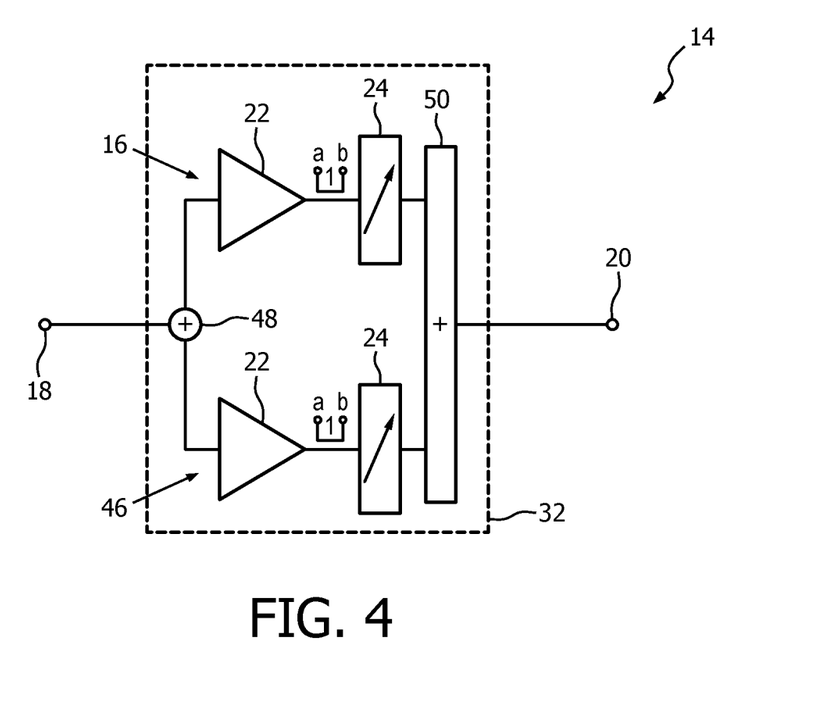
FIG. 4 shows yet another embodiment of the amplifier device.

FIG. 4 shows another embodiment of the amplifier device 14 providing a splitting of the amplifier channel by means of a splitter 48 into more than one (namely two) sub-channels 16, 46. Instead of having impedance matching in the high output power domain after the multiple combiners, it is favourable to directly impedance match individual RF units at lower power and afterwards perform RF power combination by means of a combining unit 50. The adaptive matching circuits 24 and switches are exposed to much lower RF voltages and currents and thus cheaper in production. Switching can be performed using less expensive switches and lumped element components, thus a smaller footprint can be realized (in this context the amplifier symbol refers to a sub-fraction of the MOSFET forming an amplifier channel 16 according to FIG. 3).

Figure 5:
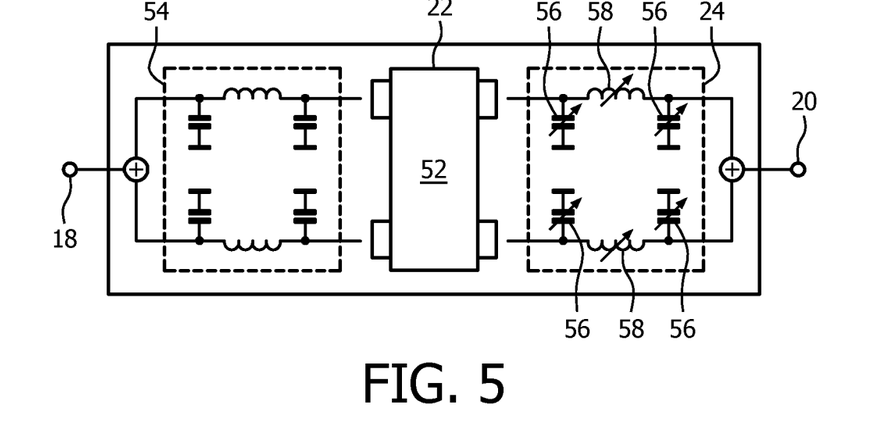
FIG. 5 shows an embodiment of the amplifier device realized with a MOSFET unit.

FIG. 5 shows an embodiment of the amplifier device 14 with a MOSFET unit 52. Each individual RF power MOSFET unit 52 is impedance matched with respect to input and output. While the input matching circuit 54 is fixed, the output matching circuit 24 can be adapted to greater than two output impedances. This can be realized using switchable or variable inductor or capacitor elements 56, 58. The MOSFET unit 52 can provide full output power to different output load, as it is impedance matched by the network. An automatic power factor correction unit comprises a number of capacitors and inductors or switchable line length that is switched by means of nonmagnetic contactors. These nonmagnetic contactors are controlled by a control interface. The interface measures power factor by directional coupler inserted in the RF chain. Depending on the load and scan protocol requests and status of the RF chain, the power factor control interface and software will switch the necessary blocks of impedances in steps to make sure the power factor stays above a selected value.

Figure 6:
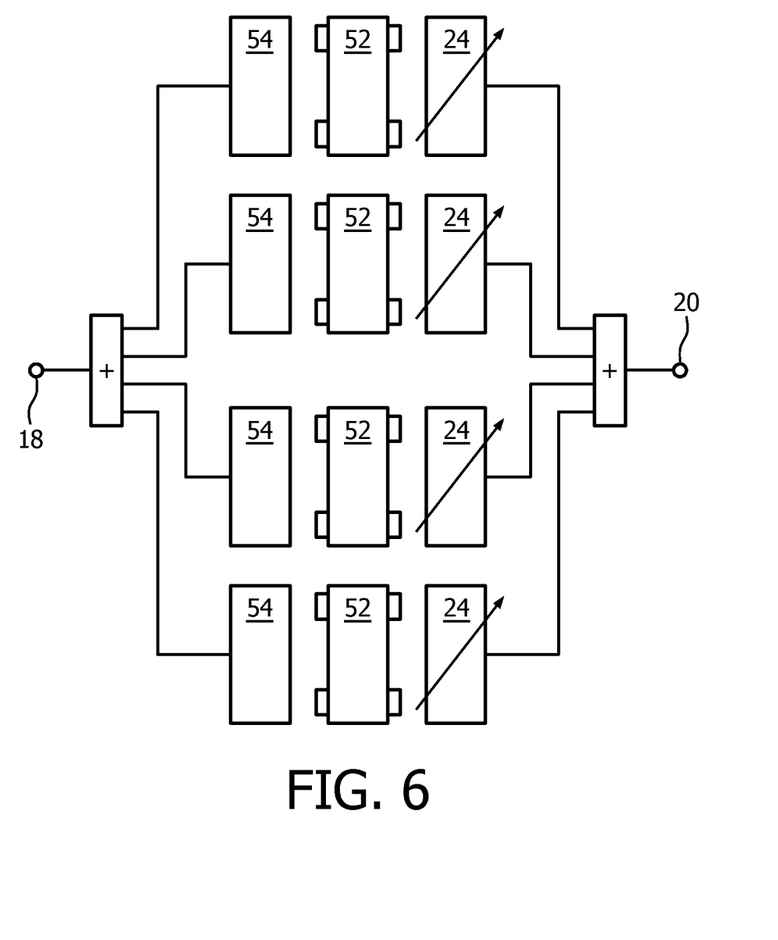
FIG. 6 shows a multi sub-channel amplifier device realized with MOSFET units.

FIG. 6 shows a multi sub-channel amplifier device 14 with several MOSFET units 52. RF power combination of parallel matched MOSFET units 52 using adaptive output matching. Typically the output matching of the MOSFET units 52 do have the same impedance transformation, so the circuits can be switched simultaneously and parallel.

Figure 7:
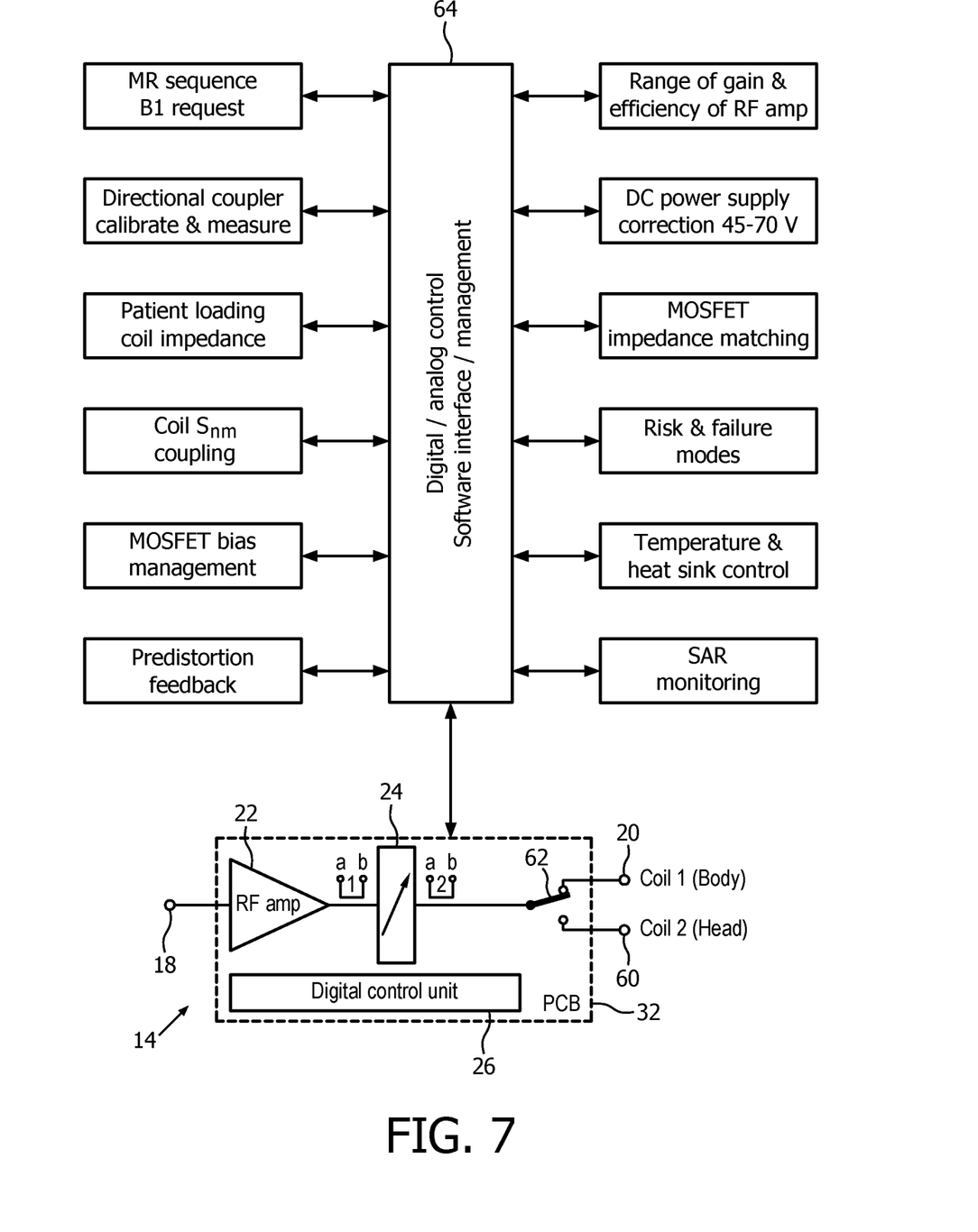
FIG. 7 shows yet another embodiment of the amplifier device.

FIG. 7 shows a RF amplifier unit 14 with a PCB 32, a second output connection device 60 and an integrated RF coil selector switch 62 to provide fast switching between different RF coils connected to the different output connection devices 20, 60. The impedance matching of the MOSFET based RF amplifier unit 22 is controlled by a digital-analog control interface 64. This interface 64 collects all data obtained from different control and status parameters and decides if and how impedance matching is performed. The internal control unit 26 with a software algorithm continuously monitors the relevant parameters and decides, if an optional impedance matching becomes relevant.

Figure 8:
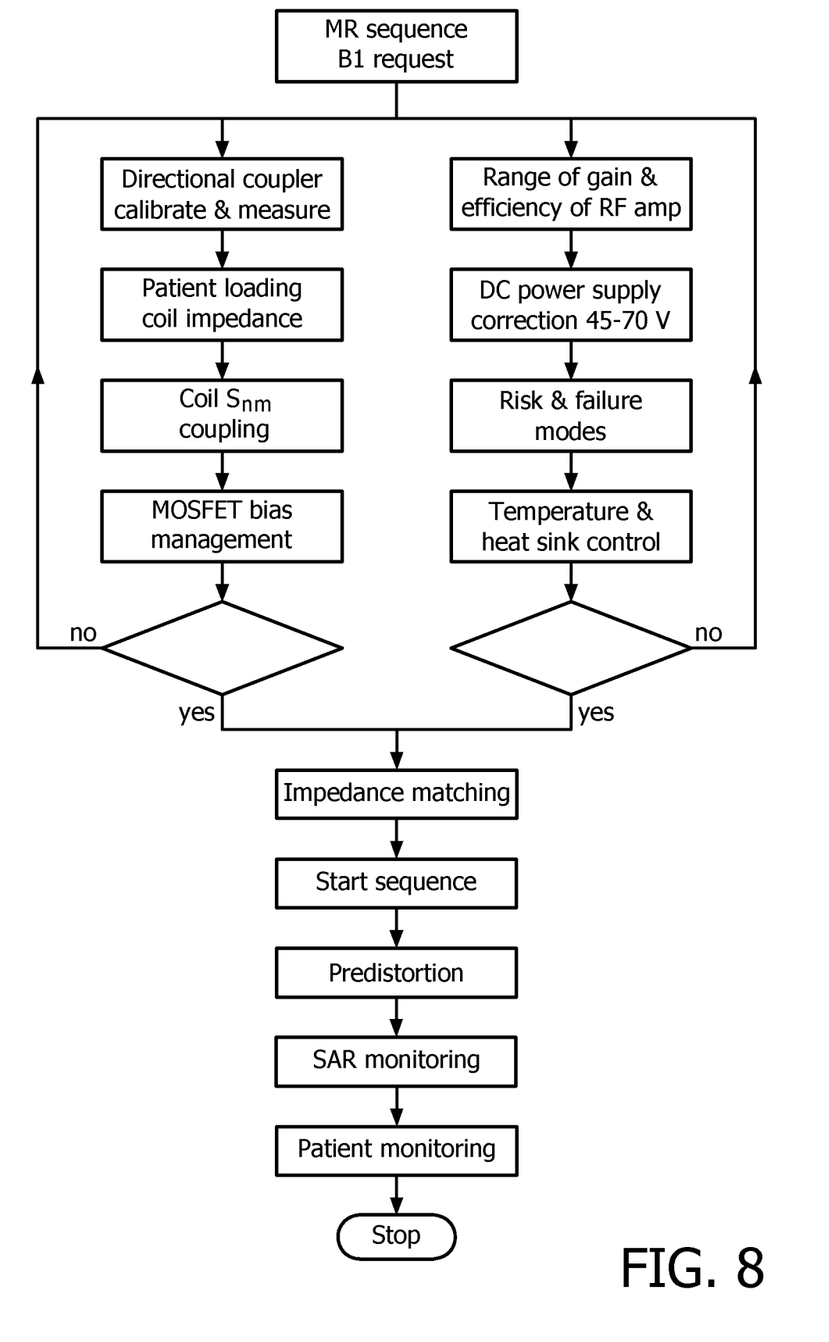
FIG. 8 shows a flowchart of a software algorithm controlling the amplifier device.

Finally, FIG. 8 shows a flowchart of a software algorithm controlling the amplifier device 14. Before the system starts preparation, the MR sequencer defines the required $B_1$ and thus the required RF power needed at the RF coil. The software algorithm controls and manages the shown parameters: "directional coupler calibrate & measure", "patient loading coil impedance", "Coil $S_{nm}$ coupling", "MOSFET Bias management", "predistortion feedback", "range of gain & efficency of RFamp", "DC power supply correction 45-70V", "MOSFET impedance matching", "risk & failure modes", "temperature heat sink control", and "SAR monitoring".

The aforementioned amplifier device 14 offers the following features and has the following advantages:

The RF amplifier device 14 is an amplifier device with integrated flexible RF power matching. Impedance matching control includes load pull data information of the RF amplifier unit 22 and includes this for the optimal matching status.

The nonmagnetic matching device is part of the MOSFET output impedance matching or of comb fined RF power stages.

The digital interface 64 collects all data obtained from different control and status parameters and decides, if and how impedance matching is performed.

A complex software algorithm controls the matching, operational parameters of the MOSFET, MRI system and MRI scan protocol requirements.

The RF amplifier universal loading concept can handle high reflection coefficients from the RF coils using an integrated matching circuit 24 in the RF amplifier device 14. The matching circuit 24 is switchable and is able to work in a high magnetic $B_0$ field. The matching circuit 24 is directly controlled from a multichannel SDR (SDR: software defined radio), which measures the loading condition from the amplifier (input impedance of the body coil).

Depending on known amplifier output parameters (gain, peak output power, linearity, efficiency—all as a function of the amplifier loading condition), the matching between amplifier unit 22 and coil is adjusted. MR sequence parameters (demand peak power, duty cycle, current amplifier temperature, status of other amplifiers within a multi-tx system) serve as additional input for the ATU.

With the intended move of the amplifier being close to the magnet, the ATU shall be placed in the amplifier device 14, reducing the number of stand-alone components.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

The invention claimed is:

1. An amplifier device for an MRI antenna, the amplifier device comprising at least one amplifier channel including:
   an input connection configured to connect to an RF signal source;
   an output connection configured to connect to the MM antenna;
   an RF amplifier; and
   an impedance matching circuit configured to adjust a coupling of the RF amplifier to the MM antenna to compensate for an actual load of the amplifier, which load results from the combination of the antenna and a person or sample interacting with the antenna, the impedance matching circuit, an electrical line, and a plurality of switches define an electrical transmission line between the RF amplifier and the antenna with an adjustable line length, and
   the impedance matching circuit including:
      a series of line segments, each line segment of a characteristic impedance Z0 and coupled by the switches to the electric line to adjust the length of the electrical transmission line, and
      an additional line segment that is (i) switchably connected to the electrical transmission line and (ii) switchably connected to ground.

2. The amplifier device as claimed in claim 1, wherein the switches are configured to effect an even number of segments coupled to the distal end of the adjusted line length between the amplifier and the load and switchable connect said even number of segments to ground provided the even number of segments form an odd number of pairs of segments.

3. The amplifier device according to claim 1, further comprising a control unit configured to measure a loading condition from the amplifier unit and control the impedance matching circuit based on the loading conditions.

4. An amplifier device for a magnetic resonance imaging system, the amplifier device comprising:
   an input configured for connection to an RF signal source;
   an output configured for connection to an RF antenna of the magnetic resonance imaging system;
   an RF amplifier;
   an electrical transmission line with an impedance matching circuit including:
      a plurality of line segments connected in series, with the input,
      a plurality of switches, each switch being connected between an end of one of the line segments and an electrical line, the electric line being connected with the output,
      an additional line segment having a first end connected with the plurality of series connected line segments and a second end,
      a first additional switch connected between the first and second ends of the additional line segment,
      a second additional switch connected between the second end of the additional line segment and ground; and
   a control unit configured to control the switches of the impedance matching circuit to adjust the impedance of the impedance matching circuit to compensate for loading of the RF antenna by a subject to be imaged by controlling the plurality of switches connected with the plurality of series connected line segments to adjust a number of the plurality of series connected line segments connected in series between the input and the output to adjust the impedance of the electrical transmission line and controlling the first and second additional switches.

5. The amplifier device according to claim 1, wherein the impedance matching circuit is configured to operate in a 7T magnetic B0 field of a corresponding MM apparatus.

6. The amplifier device according to claim 1, further comprising a printed circuit board, wherein the RF amplifier and the matching circuit are arranged on said printed circuit board.

7. The amplifier device according to one claim 1, wherein the impedance matching circuit further comprises at least one capacitive component of adjustable capacity and/or at least one inductive component of adjustable inductance.

8. The amplifier device according to claim 1, wherein the at least one amplifier channel includes a further matching circuit for impedance matching.

9. The amplifier device according to claim 8, wherein the further matching circuit is a circuit configured for fixed impedance matching.

10. The amplifier device according to claim 1, comprising a plurality of amplifier channels.

11. The amplifier device according to claim 10, wherein each channel comprises an individual RF amplifier and an individual impedance matching circuit.

12. The amplifier device according to claim 1, wherein the RF amplifier includes at least one MOSFET device.

13. An Mill apparatus comprising an RF signal source, an MM antenna, and the amplifier device according to claim 1.

* * * * *